United States Patent

Shan et al.

[11] Patent Number: 5,865,937
[45] Date of Patent: Feb. 2, 1999

[54] BROAD-BAND ADJUSTABLE POWER RATIO PHASE-INVERTING PLASMA REACTOR

[75] Inventors: Hongching Shan, San Jose; Hiroji Hanawa, Sunnyvale; Robert Wu, Pleasanton; Michael Welch, Livermore, all of Calif.

[73] Assignee: Applied Materials, Inc., Santa Clara, Calif.

[21] Appl. No.: 517,177

[22] Filed: Aug. 21, 1995

[51] Int. Cl.$^6$ ........................................ C23F 1/08
[52] U.S. Cl. ..................... 156/345; 315/111.21
[58] Field of Search ................ 156/345; 204/298.34; 118/723 E, 723 I; 216/67, 71; 315/111.21

[56] References Cited

U.S. PATENT DOCUMENTS 5,147,493 9/1992 Nishimura et al. ............... 156/345

*Primary Examiner*—Marian C. Knode
*Assistant Examiner*—Brenda G. Brumback
*Attorney, Agent, or Firm*—Michaelson & Wallace

[57] ABSTRACT

In a plasma reactor including a vacuum chamber for containing at least a reactant gas at a selected pressure and a semiconductor wafer to be processed, a pair of electrodes for capacitively coupling radio frequency power into the chamber and a radio frequency source having a radio frequency power terminal, a circuit for coupling the radio frequency source to the pair of electrodes includes a coil having plural conductive windings and a pair of terminals bounding plural ones of the windings, the pair of terminals coupled to respective ones of the pair of electrodes, one of the windings connected to the power terminal of the radio frequency source, and a grounded conductive tap contacting the coil and slidable along the plural ones of the windings between the pair of terminals for varying a ratio of power apportioned between the pair of electrodes.

36 Claims, 1 Drawing Sheet

BROAD-BAND ADJUSTABLE POWER RATIO PHASE-INVERTING PLASMA REACTOR

BACKGROUND OF THE INVENTION

1. Technical Field

The invention is related to plasma reactors of the type having a pair of electrodes for capacitively coupling radio frequency (RF) power to a plasma and in particular to improvements for permitting use of high RF frequencies and high RF power.

2. Background Art

In plasma etching of a thin film (such as a metal layer) on a semiconductor wafer, the wafer is placed within a vacuum chamber, the chamber is filled with reactive gases and RF power is coupled to the gases within the chamber to ignite and maintain a plasma therein. The plasma etches the thin film. The RF coupling to the plasma may be either capacitive or inductive. Inductive coupling is typically carried out with an inductive coil wound around the chamber and connected to an RF source. Capacitive coupling is typically carried out by a pair of electrodes, namely a cathode at the bottom of the chamber serving as a wafer pedestal on which the wafer is placed and an anode at the top of the chamber. The anode can serve as a gas distribution plate over the wafer, in which case the anode has many orifices facing the wafer through which the reactive gases are introduced into the chamber in a uniform manner. The gas distribution plate can be either grounded or connected to RF power. If the gas distribution plate/anode is grounded, the chamber wall may also be grounded so that the entire chamber wall as well as the gas distribution plate functions as an anode. In this case, the effective area of the anode is much greater than the area of the cathode/wafer pedestal.

One problem is that in etching an oxide thin film (such as silicon dioxide) from the wafer, material derived from the oxide (such as silicon) is deposited on the surfaces within the chamber exposed to the plasma. Such deposition of contaminants will accumulate most rapidly on grounded surfaces, because such surfaces are subject to the least ion bombardment from the plasma. Thus, one way of minimizing accumulation of such contaminant deposition is to apply RF power to such surfaces. Therefore, in order to keep the gas distribution plate/anode clean, and thereby suppress particle contamination, it is desirable to apply RF power to the gas distribution plate/anode, so that RF power is applied to both the anode and cathode.

One way of applying RF power to the cathode and anode might be to connect separate RF sources to each electrode. One disadvantage of this approach is that the chamber side wall would serve as the common ground for both RF sources so that a large portion of the plasma ions, rather than being confined between the two electrodes, instead would drift toward the chamber wall and away from the wafer. The problem is that such off-normal ion directionality (relative to the plane of the wafer) results in severe non-uniform oxide etch patterns and lower oxide etch rates. This problem arises because the plasma-assisted oxide etch process is largely reactive ion-driven. One solution to this problem is to power both electrodes (anode and cathode) from the opposing terminals of the same RF source, as disclosed in U.S. Pat. No. 4,626,312 to Tracy and in U.S. Pat. No. 4,871,421 to Ogle and Yin. A transformer can couple RF power to the anode and cathode, the RF source being connected across the primary winding and the anode and cathode being connected to opposite ends of the secondary winding.

There are three problems with the prior art exemplified by the patent to Tracy and the patent to Ogle and Yin. First, only low RF frequencies, on the order of 4 Mhz, may be employed. Otherwise, the power loss through the transformer would be prohibitive. A second problem is that the cathode-to-anode power ratio is not adjustable. This is a problem because in plasma etching of a dielectric or oxide thin film, a different cathode-to-anode power ratio is required, depending upon whether the process is (1) a reactive ion-driven plasma etch process or (2) a neutral species-driven ion-assisted plasma etch process (for example). In the patent to Tracy, the power ratio is floating and therefore not controllable while in the patent to Ogle and Yin the power ratio is permanently fixed at 50% (by the center ground tap on the transformer secondary winding) and therefore not adjustable. A third problem is that the ion energy is too high, resulting in unacceptably high incidence of device damage on the wafer. The high ion energy arises because the low RF frequency (which must be used to avoid power loss at the transformer) more readily accelerates the heavier plasma ions. Since the cathode/anode power ratio is not adjustable, ion energy at the cathode cannot be reduced to avoid device damage.

SUMMARY OF THE DISCLOSURE

In a plasma reactor having a pair of electrodes, including an anode and a cathode supporting the semiconductor wafer, a coil couples RF power from the RF source to the cathode and anode. The RF source is connected to an intermediate winding of the coil while the cathode and anode are coupled to respective ends of the coil, preferably through capacitors. In this way, the cathode and anode potentials are phase-inverted and provide an RF path therebetween to better confine the plasma between the cathode and anode. The cathode-to-anode power ratio is adjustable by a slidable or movable ground tap on the coil. For reactive ion-driven etching (such as silicon dioxide etching), the slidable ground tap is moved nearer the end of the coil attached to the anode or gas distribution plate. For neutral species-driven reactive ion-assisted plasma processes (such as chemical vapor deposition), the slidable ground tap is moved nearer the end of the coil attached to the cathode or wafer pedestal, which reduces the plasma potential at the wafer surface and thus reduces the ion energy at the wafer surface. Preferably, the coil is one component of an inductive-capacitive RF match network in which a variable capacitor connected in parallel with the coil is controlled in accordance with conventional techniques to maintain an RF impedance match between the load impedance across the electrodes presented by the plasma and the source impedance of the RF source.

One advantage is that the RF power on the cathode may be adjusted as desired to provide positive control over ion energy at the wafer surface, by moving the slidable ground tap on the coil. This permits the RF power to be increased to provide a higher ion current without necessarily increasing the ion energy, so that the RF power (and therefore etch rate) is not limited by any risk of wafer damage from excessive ion energy. Thus, the invention provides a higher etch rate without an accompanying increase in ion energy. This can improve etch selectivity when, for example, etching a silicon dioxide layer formed over a polysilicon layer which is not to be etched.

A related advantage is that adjusting the cathode-to-anode power ratio permits the reactor to be employed in a wide range of plasma etching processes. For example, silicon oxide etching requires a higher sputtering energy, so that a higher cathode-to-anode power ratio is desired, while etching an aluminum layer requires little sputtering energy, so that a lower cathode-to-anode power ratio is desired (to minimize ion bombardment damage, for example).

Another advantage is that the RF power loss through the coil is more than a factor of two less than the RF power loss through the transformer of the prior art, especially at higher RF frequencies so that much higher RF frequencies, as high as on the order of 100 Mhz, may be employed. This in turn reduces the energy of the heavier plasma ions, reducing device damage. Furthermore, the large frequency range (1 Khz to 100 Mhz) of the invention extends its usefulness over a larger range of different plasma processes.

The invention could be used to provide end-point control over the etch process by reducing the cathode-to-anode power ratio near the end-point of the etch process to reduce the etch rate before the end-point is reached.

DETAILED DESCRIPTION OF THE PREFERRED EMBODIMENTS

Figure 1:
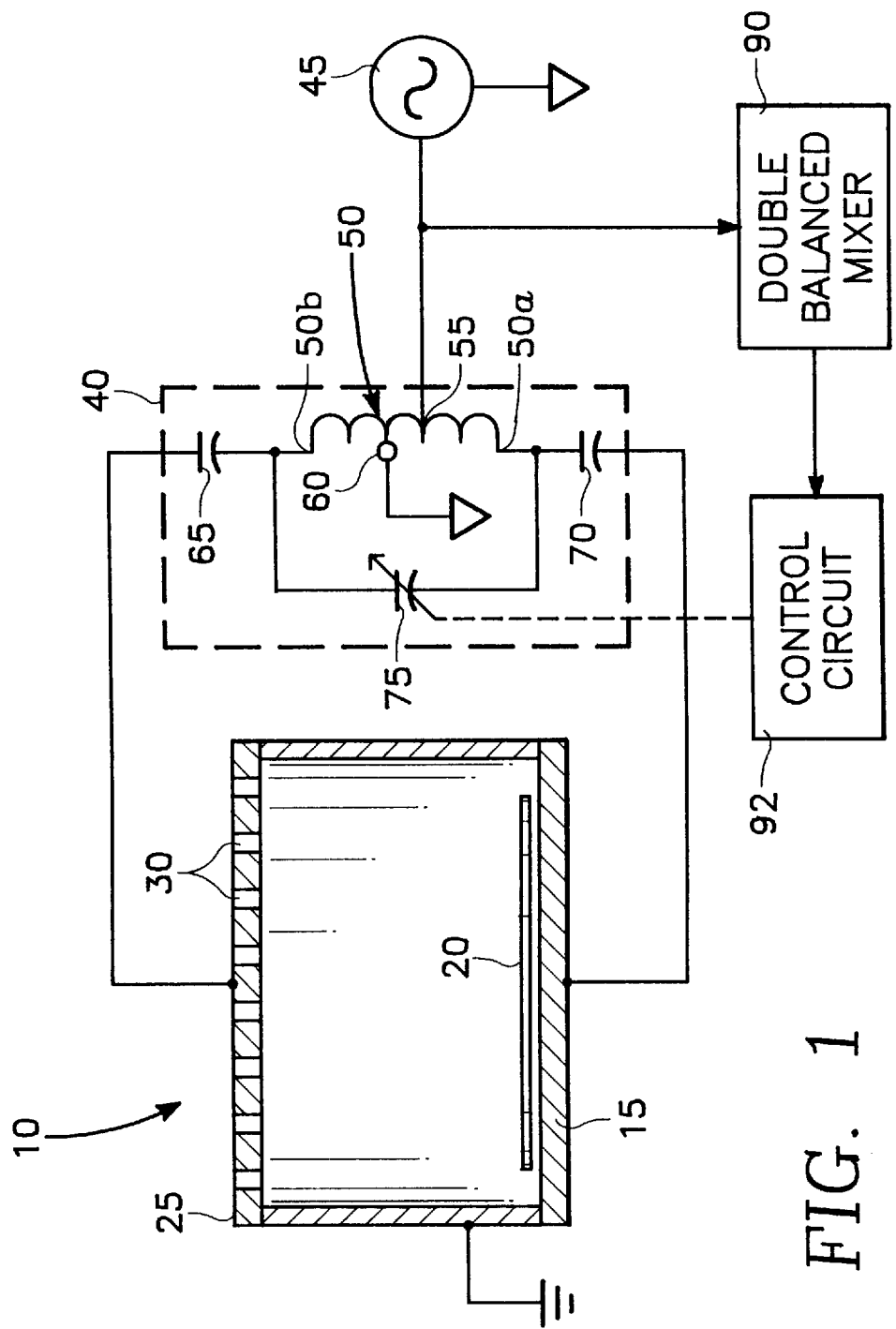
FIG. 1 is a schematic diagram of a first embodiment of the invention, a capacitively coupled plasma reactor.

Referring to FIG. 1, a generally cylindrical plasma reactor chamber 10 has a pair of electrodes including a cathode 15 on which a semiconductor wafer 20 to be processed is placed and an anode 25 which serves as a gas distribution plate having plural orifices 30 through which reactive gases are introduced into the chamber 10. The cathode and anode 15, 25 are parallel and preferably closely spaced (about 5 cm apart). A special phase-inverting match circuit 40 couples RF power from an RF source 45 to the cathode and anode 15, 25. The circuit 40 includes an inductive coil 50 having a pair of ends 50a, 50b connected through capacitors 65, 70 to the cathode and anode 15, 25, respectively. An intermediate tap 55 connects one terminal of the RF source 45 to an intermediate winding of the coil 50, the other terminal of the RF source 45 being grounded. A slidable ground tap 60 connects any selected winding of the coil 50 to ground. The slidable ground tap 60 may be moved to contact any particular winding of the coil, depending upon the desired anode-to-cathode power ratio. Preferably, the ground tap 60 is not placed on the same location on the coil 50 as the RF power tap 55.

The capacitors 65, 70 are connected in series between the respective ends of the coil 50a, 50b and the cathode and anode 15, 25, respectively. Each capacitor 65, 70 has 100 picoFarads. A variable capacitor 75 having a range of about 0–1000 picoFarads is connected in parallel with the coil 50 and is controlled in accordance with conventional techniques so as to provide an RF impedance match between the RF source 45 and the load impedance presented by the plasma between the anode and cathode 15, 25. The RF match is provided by the total reactance of the circuit including the variable capacitor 75, the series capacitors 65 and 70 and the inductive coil 50. Referring to FIG. 1, one conventional technique for maintaining such an impedance match is to tap to the output of the RF source 45 the input of a sensing circuit 90 (such as a conventional double balanced mixer) which produces an output signal indicative of reflected RF power. The reflected power output of the double balanced mixer 90 is applied to a conventional impedance match control circuit 92. The control circuit 92 is linked to the variable capacitor 75 and controls the variable capacitor 75 in proportion to the reflected RF power sensed by the double balanced mixer 90 so as to minimize the reflected RF power at the output of the RF source 45.

In a typical application the wafer 20 has a diameter of 20 cm while the chamber 10 is generally cylindrical in shape and has a diameter of about 33 cm. The coil 50 in this case is cylindrically shaped and has a diameter of about 21 cm and about 8 windings and an axial length of about 20 cm. Preferably, the RF source 45 provides 1000 Watts of power at a frequency of 13.56 Mhz. If the ground tap 60 is placed on the middle winding of the coil 50, then the ion energy at the wafer 20 is about 500 eV. The ground tap 60 is moved onto or near the coil end 50a connected to the cathode for neutral species-driven processes such as chemical vapor deposition in which low ion energies (e.g., 10 Ev) at the wafer 20 are desired. On the other hand, where high ion energies are desired for reactive ion-driven processes such as silicon oxide etch, the ground tap 60 is moved closer to the coil end 50b connected to the anode 25. For oxide etch processes, reactant gases such as carbon tetrafluoride is introduced through the gas distribution orifices 30 while a pressure of about 250 Mtorr is maintained in the chamber 10.

The RF power applied to the cathode and anode 15, 25 ignites a plasma from the reactive gases introduced into the chamber and maintains the plasma thereafter. RF power is coupled to the plasma by capacitive coupling from the cathode and anode 15, 25.

One advantage is that the RF power on the cathode may be adjusted as desired to provide positive control over ion energy at the wafer surface, by moving the slidable ground tap on the coil. This permits the RF power to be increased without necessarily increasing the ion energy, so that the RF power (and therefore etch rate) is not limited by any risk of wafer damage from excessive ion energy. Thus, the invention provides higher useful etch rates. A related advantage is that adjusting the cathode-to-anode power ratio permits the reactor to be employed in a wide range of plasma etching processes. Another advantage is that the RF power loss through the coil is more than a factor of two less than the RF power loss through the transformer of the prior art, especially at higher RF frequencies so that much higher RF frequencies, as high as on the order of 100 Mhz, may be employed. This in turn reduces the energy of the heavier plasma ions, reducing device damage. Furthermore, the large frequency range (1 kHz to 100 Mhz) of the invention extends its usefulness over a larger range of different plasma processes.

While the invention has been described in detail by specific reference to preferred embodiments, it is understood that variations and modifications thereof may be made without departing from the true spirit and scope of the invention.

What is claimed is:

1. A plasma reactor comprising:
    a vacuum chamber for containing at least a reactant gas at a selected pressure and a semiconductor wafer to be processed;
    a pair of electrodes for capacitively coupling radio frequency power into said chamber;
    a coil having a plurality of turns and a pair of terminals bounding said coil, each terminal of said pair of terminals being coupled to a different electrode of said pair of electrodes;
    a radio frequency source having a radio frequency power terminal connected to an intermediate one of said turns; and
    a grounded conductive tap contacting said coil and selectively moveable within said pair of terminals for varying a ratio of power apportioned between said pair of electrodes.

2. The reactor of claim 1 wherein a first one of said electrodes is a cathode electrode underlying said wafer and a second one of said electrodes is an anode electrode overlying said wafer.

3. The reactor of claim 2 wherein said anode electrode comprises a gas distribution plate having plural orifices for introducing said reactant gas into said chamber.

4. The reactor of claim 2 wherein said radio frequency source further has a radio frequency return terminal connected to ground and wherein said chamber has side walls connected to ground.

5. The reactor of claim 1 further comprising a variable capacitor connected in parallel with said coil and controllable for maintaining an impedance match between said radio frequency source and said pair of electrodes.

6. The reactor of claim 5 further comprising a first capacitor and a second capacitor, and wherein said first capacitor is interposed between one terminal of said pair of terminals and one electrode of said pair of electrodes, and wherein said second capacitor is interposed between the other terminal of said pair of terminals and the other electrode of said pair of electrodes.

7. The reactor of claim 2 wherein said grounded conductive tap is closer to said first terminal whereby to reduce ion energy near said wafer.

8. The reactor of claim 2 wherein said grounded conductive tap is closer to said second terminal whereby to enhance ion energy near said wafer.

9. The reactor of claim 1 wherein said grounded conductive tap is movable along direction parallel to a cylindrical axis of said coil.

10. In a plasma reactor including a vacuum chamber for containing at least a reactant gas at a selected pressure and a semiconductor wafer to be processed, a pair of electrodes for capacitively coupling radio frequency power into said chamber and a radio frequency source having a radio frequency power terminal, a circuit for coupling said radio frequency source to said pair of electrodes, said circuit comprising:

a coil having a plurality of turns and a pair of terminals bounding said coil, each terminal of said pair of terminals being coupled to a different electrode of a pair of capacitive electrodes, one of said turns being connected to a power terminal of a radio frequency source; and a grounded conductive tap contacting said coil and selectively movable within said pair of terminals for varying a ratio of power apportioned between said pair of electrodes.

11. The reactor of claim 10 wherein a first one of said electrodes is a cathode electrode underlying a wafer and a second one of said electrodes is an anode electrode overlying said wafer.

12. The reactor of claim 11 wherein said anode electrode comprises a gas distribution plate having plural orifices for introducing reactant gas into the chamber.

13. The reactor of claim 11 further comprising a radio frequency source, said radio frequency source having a radio frequency return terminal connected to ground and wherein the chamber has side walls connected to ground.

14. The reactor of claim 10 further comprising a variable capacitor connected in parallel with said coil and controllable for maintaining an impedance match between said radio frequency source and said pair of electrodes.

15. The reactor of claim 14 further comprising a first capacitor and a second capacitor, and wherein said first capacitor is interposed between one terminal of said pair of terminals and one electrode of said pair of electrodes, and wherein said second capacitor is interposed between the other terminal of said pair of terminals and the other electrode of said pair of electrodes.

16. The reactor of claim 11 wherein said grounded conductive tap is closer to said first terminal whereby to reduce ion energy near said wafer.

17. The reactor of claim 11 wherein said grounded conductive tap is closer to said second terminal whereby to enhance ion energy near said wafer.

18. The reactor of claim 10 wherein said conductive tap is a slidable tap.

19. A plasma reactor comprising:

a chamber for containing a wafer;

a pair of electrodes for capacitively coupling power into the chamber;

a coil having a plurality of turns and a pair of terminals bounding the coil, each terminal being coupled to a different one of the pair of electrodes;

a radio frequency source having a radio frequency power terminal connected to an intermediate one of the turns;

a conductive tap coupled to ground;

the conductive tap being in contact with the coil, the conductive tap thereby defining a power distribution ratio between the pair of terminals; and the conductive tap being movable along the coil so that the power distribution ratio varies with the movement of the conductive tap.

20. The reactor of claim 19 wherein a first one of the pair of electrodes is a cathode electrode underlying the wafer and a second one of the pair of electrodes is an anode electrode overlying the wafer.

21. The reactor of claim 19 wherein the conductive tap is movable along direction parallel to a cylindrical axis.

22. The reactor of claim 19 further comprising a variable capacitor connected in parallel with the coil, the variable capacitor being controllable for maintaining an impedance match between the radio frequency source and the pair of electrodes.

23. The reactor of claim 20 wherein the anode electrode comprises a gas distribution plate having plural orifices for introducing the reactant gas into the chamber.

24. The reactor of claim 20 wherein the conductive tap is closer to a first one of the pair of terminals so as to reduce ion energy near the wafer.

25. The reactor of claim 20 wherein the conductive tap is closer to a second one of the pair of terminals so as to enhance ion energy near the wafer.

26. The reactor of claim 20 wherein the radio frequency source further comprises a radio frequency return terminal connected to ground and wherein the chamber has side walls connected to ground.

27. The reactor of claim 22 further comprising a first capacitor and a second capacitor, and wherein the first capacitor is interposed between one terminal of the pair of terminals and one electrode of the pair of electrodes, and wherein the second capacitor is interposed between the other terminal of the pair of terminals and the other electrode of the pair of electrodes.

28. A plasma reactor comprising:

a chamber for containing a wafer;

a pair of electrodes for capacitively coupling power into the chamber;

a coil having a plurality of turns and a pair of terminals bounding the coil, each terminal being coupled to a different one of the pair of electrodes;

a radio frequency source having a radio frequency power terminal coupled to an intermediate one of the turns so as to deliver radio frequency power to the coil;

a conductive tap coupled to ground;

the conductive tap being coupled to the coil;

the conductive tap being coupled to ground and to the coil so as to determine the distribution of the radio frequency power to each terminal; and the conductive tap being coupled to the coil so as to allow movement of the conductive tap along the coil, the conductive tap thereby allowing adjustment of the distribution of the radio frequency power to each terminal.

29. The reactor of claim 28 wherein a first one of the pair of electrodes is a cathode electrode underlying the wafer and a second one of the pair of electrodes is an anode electrode overlying the wafer.

30. The reactor of claim 28 further comprising a variable capacitor connected in parallel with the coil, the variable capacitor being controllable for maintaining an impedance match between the radio frequency source and the pair of electrodes.

31. The reactor of claim 28 wherein the conductive tap is movable along direction parallel to a cylindrical axis.

32. The reactor of claim 29 wherein the anode electrode comprises a gas distribution plate having plural orifices for introducing the reactant gas into the chamber.

33. The reactor of claim 29 wherein the radio frequency source further comprises a radio frequency return terminal connected to ground and wherein the chamber has side walls connected to ground.

34. The reactor of claim 29 wherein the conductive tap is closer to the first terminal so as to reduce ion energy near the wafer.

35. The reactor of claim 29 wherein the conductive tap is closer to the second terminal so as to enhance ion energy near the wafer.

36. The reactor of claim 30 further comprising a first capacitor and a second capacitor, and wherein the first capacitor is interposed between one terminal of the pair of terminals and one electrode of the pair of electrodes, and wherein the second capacitor is interposed between the other terminal of the pair of terminals and the other electrode of the pair of electrodes.

\* \* \* \* \*